(12) United States Patent
Li et al.

(10) Patent No.: US 9,419,109 B2
(45) Date of Patent: Aug. 16, 2016

(54) SEMICONDUCTOR DEVICE AND METHOD FOR FABRICATING THE SAME

(71) Applicant: UNITED MICROELECTRONICS CORP., Hsinchu (TW)

(72) Inventors: Jhen-Cyuan Li, New Taipei (TW); Shui-Yen Lu, Tainan (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 14/556,690

(22) Filed: Dec. 1, 2014

(65) Prior Publication Data
US 2016/0118481 A1 Apr. 28, 2016

(30) Foreign Application Priority Data
Oct. 24, 2014 (TW) .............................. 103136776 A

(51) Int. Cl.
*H01L 21/00* (2006.01)
*H01L 21/02* (2006.01)
*H01L 29/66* (2006.01)
*H01L 29/78* (2006.01)

(52) U.S. Cl.
CPC .... *H01L 29/66795* (2013.01); *H01L 29/66545* (2013.01); *H01L 29/7851* (2013.01)

(58) Field of Classification Search
CPC ... H01L 27/088; H01L 29/78; H01L 21/8234; H01L 21/76; H01L 29/66; H01L 21/22; H01L 21/02; H01L 21/84; H01L 21/76838; H01L 21/31116; H01L 21/31144; H01L 21/32137; H01L 21/32136; H01L 21/32139; H01L 21/76802; H01L 2924/01078; H01L 2924/01079; H01L 27/76843
USPC ......... 438/254, 151, 279, 584, 588, 689, 738, 438/734, 749
See application file for complete search history.

(56) References Cited

U.S. PATENT DOCUMENTS

| | | | |
|---|---|---|---|
| 6,849,557 B1 * | 2/2005 | Ko | H01L 21/76802 257/E21.252 |
| 8,673,709 B2 | 3/2014 | Lee et al. | |
| 8,703,556 B2 | 4/2014 | Kelly et al. | |
| 2011/0133292 A1 * | 6/2011 | Lee | H01L 21/823431 257/401 |
| 2014/0097482 A1 * | 4/2014 | Tokunaga | H01L 21/28273 257/316 |

OTHER PUBLICATIONS

Man-Ling Lu, Yu-Hsiang Hung, Chung-Fu Chang, Yen-Liang Wu, Wen-Jiun Shen, Chia-Jong Liu, Ssu-I Fu, and Yi-Wei Chen; U.S. Appl. No. 14/462,114, "Semiconductor Device and Method for Forming the Same," filed Aug. 18, 2014.

* cited by examiner

*Primary Examiner* — Chuong A Luu
(74) *Attorney, Agent, or Firm* — WPAT, PC; Justin King

(57) ABSTRACT

A semiconductor device comprises a substrate, a gate structure and a gate spacer. The substrate has a semiconductor fin protruding from a surface of the substrate. The gate structure is disposed on the semiconductor fin. The gate spacer is disposed on sidewalls of the gate structure, wherein the gate spacer comprises a first material layer and a second material layer stacked with each other and both of these two material layers are directly in contact with the gate structure.

13 Claims, 7 Drawing Sheets

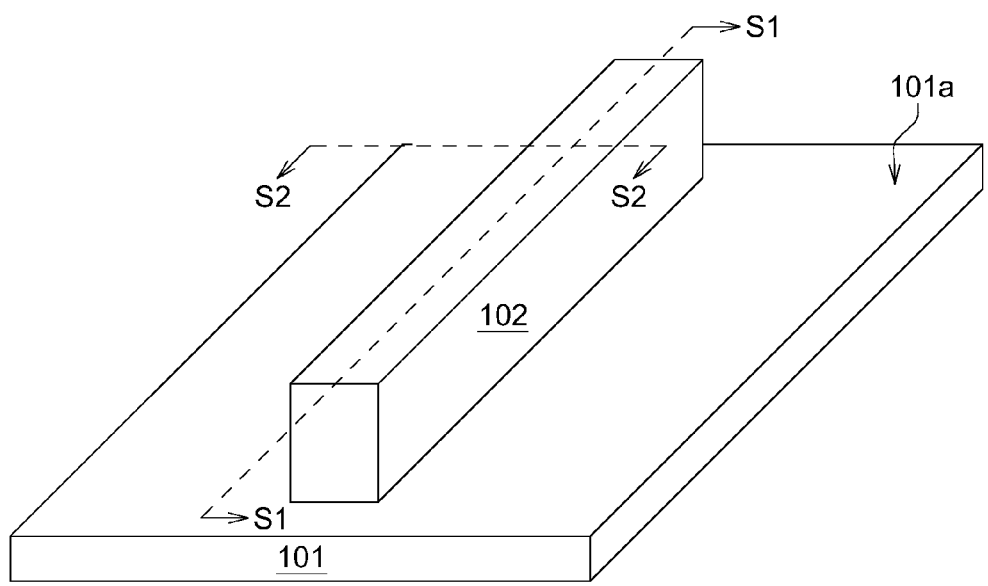
FIG. 1A
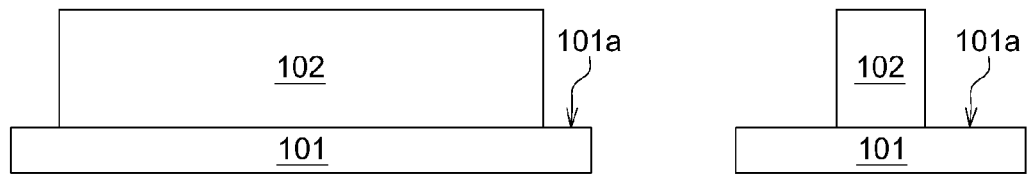
FIG. 1A'  FIG. 1A"

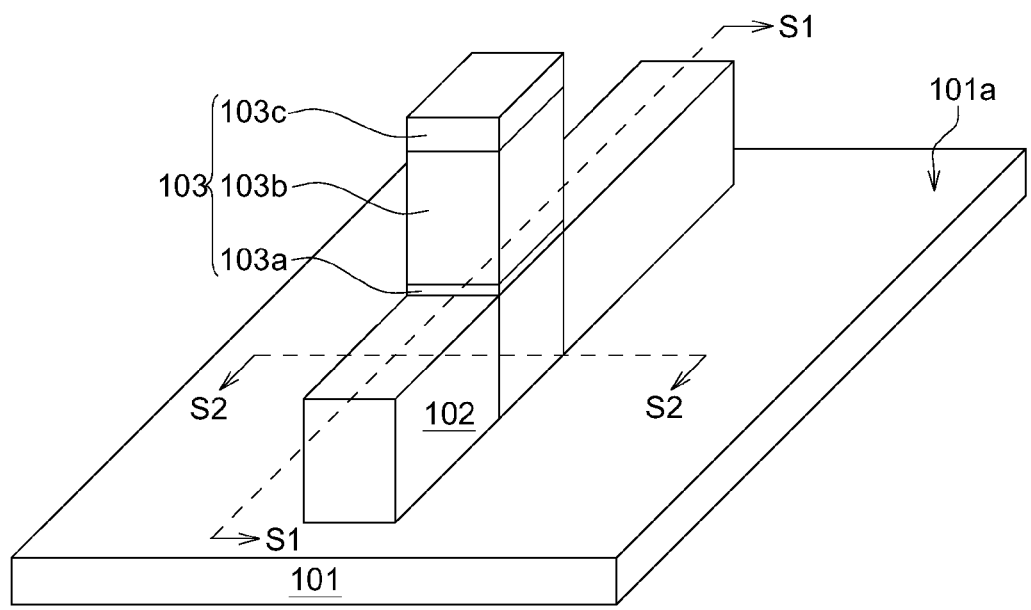
FIG. 1B
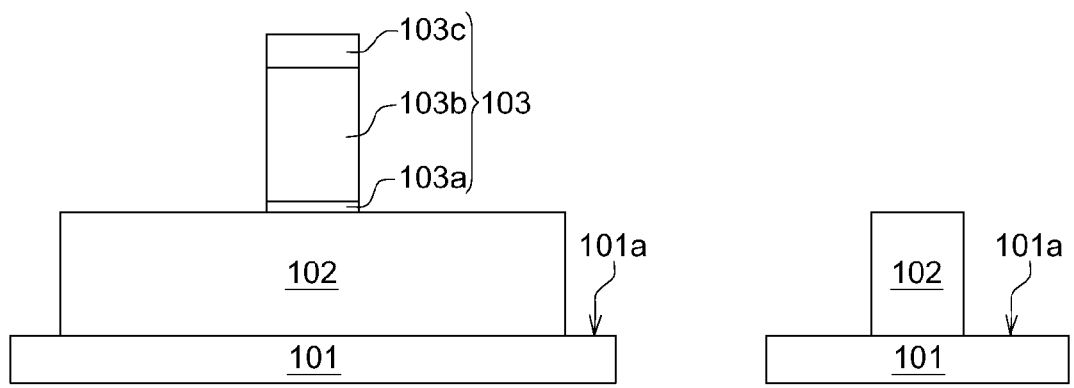
FIG. 1B'  FIG. 1B"

SEMICONDUCTOR DEVICE AND METHOD FOR FABRICATING THE SAME

This application claims the benefit of Taiwan application Serial No. 103136776, filed Oct. 24, 2014, the subject matter of which is incorporated herein by reference.

BACKGROUND

1. Technical Field

The disclosure in generally relates to a semiconductor device and method for fabricating the same, and more particularly to a fin field-effect transistor (FinFET) and method for fabricating the same.

2. Description of the Related Art

As the evolution of semiconductor process, technology node has progressed into nanometer-scale phenomena, a semiconductor device with higher functional density is provided. However, the critical sizes and features dimension of the semiconductor device are simultaneously shrunk small enough to make it challenging to produce a semiconductor device with the advantages of higher functional density without deteriorating the device performance. For overcoming the challenge, a semiconductor device with a three-dimension design, such as a FinFET, is provided.

A FinFET is typically made by steps as follows: A portion of a silicon layer disposed on a substrate is removed by an etch process to form a vertical fin protruding from a surface of the substrate. A gate structure is then provided covering on a top surface and sidewalls of the vertical fin to form a channel in the vertical fin, thereby an active region expending form the top surface to the sidewalls of the vertical fin can be defined. In addition, a strained silicon/silicon-germanium (Si/SiGe) strained source/drain may be formed in the vertical fin adjacent to the gate structure by an optional epitaxial growth process in order to improve the carrier mobility of the FinFET.

However, there are still many challenges to satisfy the stringent requirement for fabricating a FinFET with decreasing feature sizes. For example, during the process for fabricating the FinFET, the scale (size) and the accuracy of components may be deteriorated due to the over etch of the vertical fin and the spacer material while a gate spacer is formed on sidewalls of the gate structure, and whereby the yield and quality of the FinFET is adversely affected by the loss of the vertical fin and the spacer material.

Therefore, there is a need of providing an improved semiconductor device and method for fabricating the same to obviate the drawbacks encountered from the prior art.

SUMMARY

One aspect of the present invention is to provide a semiconductor device, wherein the semiconductor device comprises a substrate, a gate structure and a gate spacer. The substrate has a semiconductor fin protruding from a surface of the substrate. The gate structure is disposed on the semiconductor fin. The gate spacer is disposed on sidewalls of the gate structure, wherein the gate spacer comprises a first material layer and a second material layer stacked with each other and both of these two material layers are directly in contact with the gate structure.

According to another aspect of the present invention, a method for fabricating a semiconductor device is disclosed, wherein the method comprises steps as follows: Firstly, a substrate is provided, wherein the substrate has a semiconductor fin protruding from a surface of the substrate. Next, a gate structure is formed on the semiconductor fin. A stacking structure is then formed covering on the gate structure and the semiconductor fin, wherein the stacking structure at least comprises a first material layer, a second material layer and a third material layer stacked in sequence. Subsequently, a first etching process and a second etching process are sequentially performed, wherein the first etching process has an etching rate for removing the third material layer substantially greater than that for removing the second material layer; and the second etching process has an etching rate for removing the second material layer substantially greater than that for removing the first material layer.

In accordance with the aforementioned embodiments of the present invention, a semiconductor device and method for fabricating the same are provided. In some embodiments, a gate structure is firstly formed on a semiconductor fin protruding from a surface of a substrate. A tri-layer stacking structure, such as a silicon oxide-silicon nitride-silicon oxide (ONO) structure, a silicon nitride-silicon oxide-silicon nitride (NON) structure or a silicon nitride-silicon oxide-metal (NOM) structure, is then formed to cover the gate structure. Subsequently, at least two etching processes are sequentially performed to form a gate spacer disposed on sidewalls of the gate structure. Each of the at least two etching processes can be precisely controlled due to the distinct etching selectivity of these etching processes for removing each two adjacent layers of these tree material layers that constitutes the tri-layer stacking structure. Thus, the problems of fin loss and spacer loss can be avoided by applying the tri-layer stacking structure during the process for defining the gate spacer.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 1A is a prospective view illustrating a substrate having a fin in accordance with one embodiment of the present invention;

FIG. 1A' illustrates a cross-sectional view of the substrate taken along with a line S1 shown in FIG. 1A;

FIG. 1A" illustrates a cross-sectional view of the substrate taken along with a line S2 shown in FIG. 1A;

FIG. 1B, FIG. 1B' and FIG. 1B" are cross-sectional views respectively illustrating the resulting structure after a gate structure is formed on the structure depicted in FIG. 1A, FIG. 1A' and FIG. 1A";

DETAILED DESCRIPTION

Figure 1C:
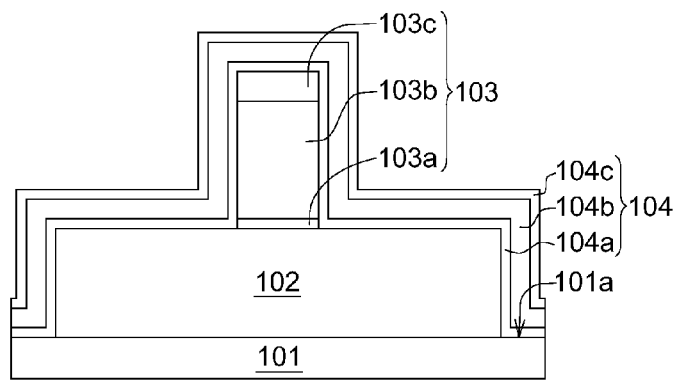
FIG. 1C and FIG. 1C' are cross-sectional views respectively illustrating the resulting structure after a stacking structure is formed on the structure depicted in FIG. 1B' and FIG. 1B"
Figure 1C:
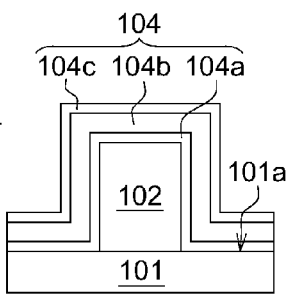

The embodiments as illustrated below provide a semiconductor device and method for fabricating the same. The present invention will now be described more specifically with reference to the following embodiments illustrating the structure and method for fabricating a FinFET.

It is to be noted that the following descriptions of preferred embodiments of this invention are presented herein for purpose of illustration and description only. It is not intended to be exhaustive or to be limited to the precise form disclosed. Also, it is also important to point out that there may be other features, elements, steps and parameters for implementing the embodiments of the present disclosure which are not specifically illustrated. Thus, the specification and the drawings are to be regard as an illustrative sense rather than a restrictive sense. Various modifications and similar arrangements may be provided by the persons skilled in the art within the spirit and scope of the present invention. In addition, the illustrations may not be necessarily be drawn to scale, and the identical elements of the embodiments are designated with the same reference numerals.

The method for fabricating a FinFET 100 comprises several steps as follows: Firstly, a substrate 101 is provided, wherein the substrate 101 has a surface 101a and a semiconductor fin 102 protruding from the surface 101a of the substrate 101. FIG. 1A is a prospective view illustrating the substrate 101 in accordance with one embodiment of the present invention; FIG. 1A' illustrates a cross-sectional view of the substrate 101 taken along with a line S1 shown in FIG. 1A; FIG. 1A" illustrates a cross-sectional view of the substrate 101 taken along with a line S2 shown in FIG. 1A.

In some embodiments of the present invention the substrate 101 may be a silicon wafer comprising a poly-silicon structure. In some other embodiments of the present invention, the substrate 101 may comprise other elemental semiconductor, such as crystal germanium (Ge), compound semiconductor, such as silicon carbide (SiC), gallium arsenide (GaAs), gallium phosphide (GaP), iodine phosphide (IP), arsenic iodine (AsI) or antimony iodide (SbI), or the arbitrary combinations thereof. In yet another embodiment, the substrate 101 may be a silicon-on-insulator (SOI) substrate having an isolation layer. In the present embodiment, the substrate 101 preferably is a bulk wafer made of poly-silicon.

The fin 102 is the structure comprises one or more silicon fin (Si-fin) protruding from the surface 101a of the poly-silicon wafer. The forming of the fin 102 comprises steps as follows: A photoresist layer (not shown) patterned by a lithography process is firstly formed on the substrate 101. Next, an etching process is performed to remove a portion of the substrate 101 (the bulk wafer), so as to form at least one silicon-fin protruding from the surface 101a of the substrate 101.

It should be appreciated that, in some other embodiments, the substrate 101 may have a plurality of silicon-fins like the fin 102 formed thereon, nevertheless there is single one silicon-fin is shown in FIGS. 1A, 1A' and 1A" for purpose of concise description.

A gate structure 103 is then formed on the fin 102 and the substrate 101 in a manner of covering a top surface and sidewalls of the fin 102. FIG. 1B, FIG. 1B' and FIG. 1B" are cross-sectional views respectively illustrating the resulting structure after the gate structure 103 is formed on the structure depicted in FIG. 1A, FIG. 1A' and FIG. 1A".

The gate structure 103 is a stacking structure comprising a gate dielectric layer 103a, a gate electrode layer 103b and a hard mask layer 103c. The gate dielectric layer 103a is disposed on the fin 102 and the substrate 101 and made of a dielectric material comprising silicon dioxide ($SiO_2$), silicon nitride (SiN), silicon oxynitride (SiON), other suitable dielectric materials or the arbitrary combinations thereof. The gate electrode layer 103b is disposed on the gate dielectric layer 103a and preferably is made of poly-silicon. The hard mask layer 103c is disposed on the gate electrode layer 103b. Suitable material for forming the hard mask layer 103c may comprise silicon carbide (SiC), silicon oxycarbide (SiOC), spin-on glass (SOG), silicon oxides prepared by tetraethyl orthosilicate (TEOS) based precursor, plasma enhanced oxide (PE-oxide), or other suitable materials.

In the present embodiment, the forming of the gate structure 103 comprises steps as follows: A dielectric layer, a poly-silicon layer and a hard mask material layer (not shown) are formed in sequence on the fin 102 and the substrate 101 by a deposition process, such as a chemical vapor deposition (CVD), a physical vapor deposition (PVD), an atomic layer deposition (ALD), a high density plasma chemical vapor deposition (HDPCVD), a metal organic chemical vapor deposition (MOCVD), a remote plasma-enhanced chemical vapor deposition (RPCVD), a plasma-enhanced chemical vapor deposition (PECVD), electroplate, or other suitable process or/and the arbitrary combinations thereof. A lithography-etching process is then performed to remove portions of the dielectric layer, the poly-silicon layer and the hear mask material layer to form the gate structure 103 as illustrated in FIGS. 1B, 1B' and 1B".

FIG. 1C and FIG. 1C' are cross-sectional views respectively illustrating the resulting structure after a stacking structure 104 is formed on the structure depicted in FIG. 1B' and FIG. 1B". The stacking structure 104 at least comprises a first material layer 104a, a second material layer 104b and a third material layer 104c stacked in sequence. In some embodiments of the present invention, the first material layer 104a may be a silicon oxide layer formed on the gate structure 103 and the sidewalls of the fin 102 by a deposition process or a thermal oxidation process; the second material layer 104b may be a silicon nitride layer formed on the first material layer 104a by a deposition process; and the third material layer 104c may be a silicon oxide layer formed on the second material layer 104b by a deposition process or a thermal oxidation process.

In another embodiment of the present invention, the first material layer 104a may be a silicon nitride layer formed on the gate structure 103 and the sidewalls of the fin 102 by a deposition process; the second material layer 104b may be a silicon oxide layer formed on the first material layer 104a by a deposition process or a thermal oxidation process; and the third material layer 104c may be a silicon nitride layer formed on the second material layer 104b by a deposition process. In yet another embodiment of the present invention, the third material layer 104c may be made of material comprising metal, such as Aluminum (Al) or tungsten (W).

Figure 1D:
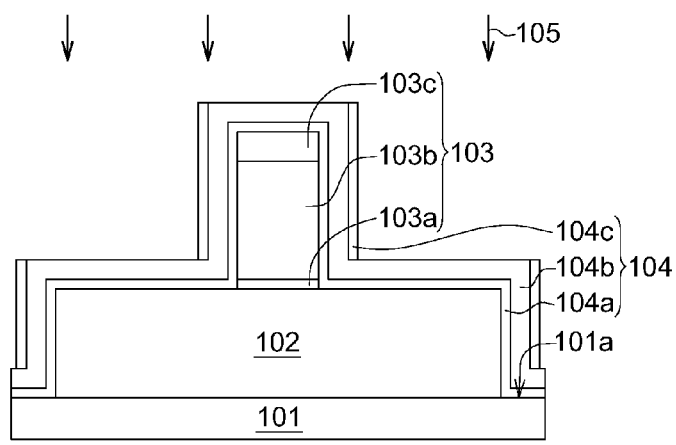
FIG. 1D and FIG. 1D' are cross-sectional views respectively illustrating the resulting structure after a first etching process is performed on the structure depicted in FIG. 1C and FIG. 1C'.
Figure 1D:
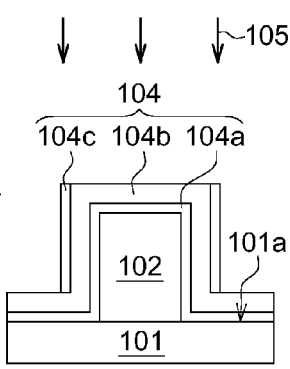

Subsequently, a first etching process 105 is performed using the second material layer 104b as an etching stop layer to remove a portion of the third material layer 104c, otherwise to remain another portion of the third material layer 104c that is disposed on the sidewalls of the gate structure 103. FIG. 1D and FIG. 1D' are cross-sectional views respectively illustrating the resulting structure after the first etching process 105 is performed on the structure depicted in FIG. 1C and FIG. 1C'. In some embodiments of the present invention, the first etching process 105 may be a dry etching process, and the reactive gas of the dry etching process may be varied in accordance with the selection of the materials chosen to constitute the first material layer 104a, the second material layer 104b and the third material layer 104c.

For example, when the first material layer 104a, the second material layer 104b and the third material layer 104c are respectively made of silicon oxide, silicon nitride and silicon oxide; carbon tetrafluoromethane ($CF_4$) may be used as the reactive gas of the first etching process 105 to remove the portion of the third material layer 104c. Alternatively, when the first material layer 104a, the second material layer 104b and the third material layer 104c are respectively made of silicon nitride, silicon oxide and silicon nitride, the reactive gas of the first etching process 105 may comprises fluoromethane ($CH_3F$), fluoromethane ($CH_2F_2$) or the combination thereof used to remove the portion of the third material layer 104c.

In the embodiments of the present invention, the first etching process 105 has an etching rate for removing the third material layer 104c substantially greater than that for removing the second material layer 104b. In some preferred embodiments of the present invention, the etching rate for removing the third material layer 104c may be 10 times greater than that for removing the second material layer 104b during the first etching process 105. In other words, the etching selectivity of the first etching process 105 for removing the third material layer 104c and the second material layer 104b is substantially greater than 10.

Thereafter, a second etching process 106 is performed using the first material layer 104a as an etching stop layer to remove a portion of the second material layer 104b, otherwise to remain another portion of the second material layer 104b that is disposed on the sidewalls of the gate structure 103. In some embodiments of the present invention, the second etching process 106 may be a dry etching process, and the reactive gas of the dry etching process may vary in accordance with the selection of the materials chosen to constitute the first material layer 104a and the second material layer 104b. In addition, the second etching process 106 may be divided into two steps, one of which is a vertical removing step 106a and the other is an isotropic removing step 106b, by adjusting the composition and proposition of the reactive gas applied during the second etching process 106.

Figure 1E:
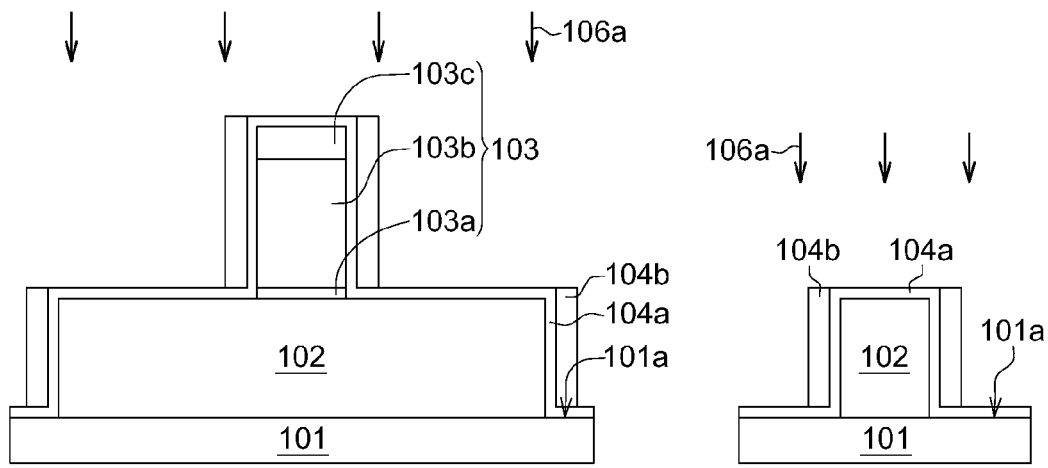
FIG. 1E and FIG. 1E' are cross-sectional views respectively illustrating the resulting structure after a vertical removing step of a second etching process is performed on the structure depicted in FIG. 1D and FIG. 1D'.

FIG. 1E and FIG. 1E' are cross-sectional views respectively illustrating the resulting structure after the vertical removing step 106a of the second etching process 106 is performed on the structure depicted in FIG. 1D and FIG. 1D'. In the present embodiment, the vertical removing step 106a is performed using the first material layer 104a as an etching stop layer and preferably using $CH_3F$ as the primary reactive gas to remove most portion of the silicon nitride based second material layer 104b covering on the first material layer 104a, otherwise to remain the portion of the second material layer 104b which is covered by the remaining portion of the third material layer 104c disposed on sidewalls of the gate structure 103.

Wherein the vertical removing step 106a of the second etching process 106 has an etching rate for removing the second material layer 104b substantially greater than that for removing the first material layer 104a. In some embodiments of the present invention, the etching rate of the vertical removing step 106a for removing the second material layer 104b may be 10 times greater than that for removing the first material layer 104a.

Figure 1F:
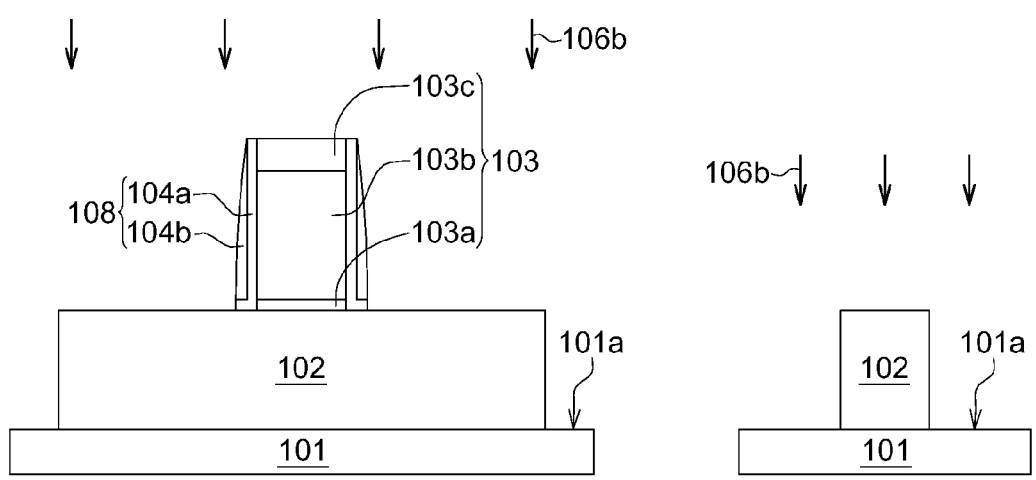
FIG. 1F and FIG. 1F' are cross-sectional views respectively illustrating the resulting structure after an isotropic removing step of the second etching process is performed on the structure depicted in FIG. 1E and FIG. 1E'.

FIG. 1F and FIG. 1F' are cross-sectional views respectively illustrating the resulting structure after the isotropic removing step 106b of the second etching process 106 is performed on the structure depicted in FIG. 1E and FIG. 1E'. In the present embodiment, $CH_2F_2$ is preferably used as the primary reactive gas to removing the remaining portion of the third material layer 104c, the portion of the first material layer 104a that are disposed on the sidewalls of the fin 102 but not covered by the remaining portion of the second material layer 104b, and the portion of the first material layer 104a covering on the surface 101a of the substrate 101, during the isotropic removing step 106b. As a result, merely portions of the first material layer 104a and the second material layer 104b disposed on the sidewalls of the gate structure 103 are remained to serve as a gate spacer 108.

Of note that the reactive gases used by the first etching process 105 and second etching process 106 may not be limited to the disclosed components. The composition and proposition of the reactive gas may be varied in accordance with the selection of materials chosen to constitute the first material layer 104a, the second material layer 104b and the third material layer 104c to obtain a proper etching selectivity for implementing the first etching process 105 and second etching process 106.

Since, the first etching process 105 and second etching process 106 respectively has a distinct etching selectivity to removing two adjacent layers of the first material layer 104a, the second material layer 104b and the third material layer 104c that constitute the stacking structure 104, thus the first etching process 105 and second etching process 106 can be precisely controlled to define the gate spacer 108. As a result, the thickness variation of the gate spacer 108 can be kept stable without beyond the process tolerance, the fin 102 can be protected from being damaged during the first etching process 105 and second etching process 106. In other words, the problems of fin loss and spacer loss due to the over etch of the etching process for defining the gate spacer 108 may be avoided.

Figure 1G:
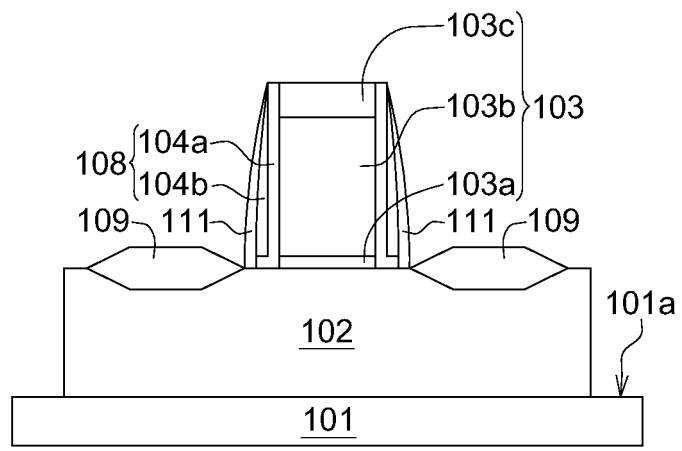
FIG. 1G is a cross-sectional view illustrating the resulting structure after a source/drain structure is formed on the structure depicted in FIG. 1F.

Subsequently, a source/drain structure 109 can be formed on the fin 102 adjacent to the gate structure 103. FIG. 1G is a cross-sectional view illustrating the resulting structure after the source/drain structure 109 is formed on the structure depicted in FIG. 1F. In some embodiments of the present invention, the forming of the source/drain structure 109 comprises steps of performing an etching process to form a plurality of openings (not shown), and performing a series deposition processes and doping processes to form the source/drain structure 109 having epitaxy silicon germanium (SiGe)/silicon phosphide (SiP) in the opening. In another embodiment of the present invention, the forming of the source/drain structure 109 further comprises a step of forming another spacer 111 on the sidewalls of the gate spacer 108.

Figure 1H:
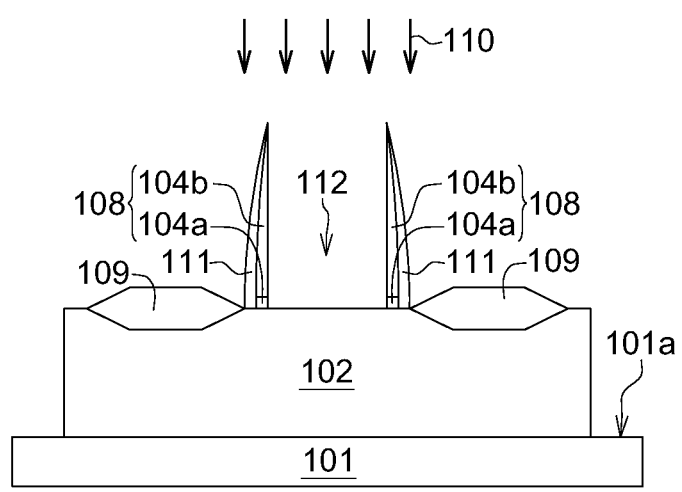
FIG. 1H is a cross-sectional view illustrating the resulting structure after a gate removing process is performed on the structure depicted in FIG. 1G.

After the gate spacer 108 is formed, a gate removing process 110 is performed to remove the gate structure 103. FIG. 1H is a cross-sectional view illustrating the resulting structure after the gate removing process 110 is performed on the structure depicted in FIG. 1G. In some embodiments of the present invention, a portion of the remaining first material layer 104a that constitutes the gate spacer 108 and directly in contact with the gate structure 103 may be also removed by the gate removing process 110, so as to form an opening 112 exposing portions of the remaining first material layer 104a and the second material layer 104b.

Figure 1I:
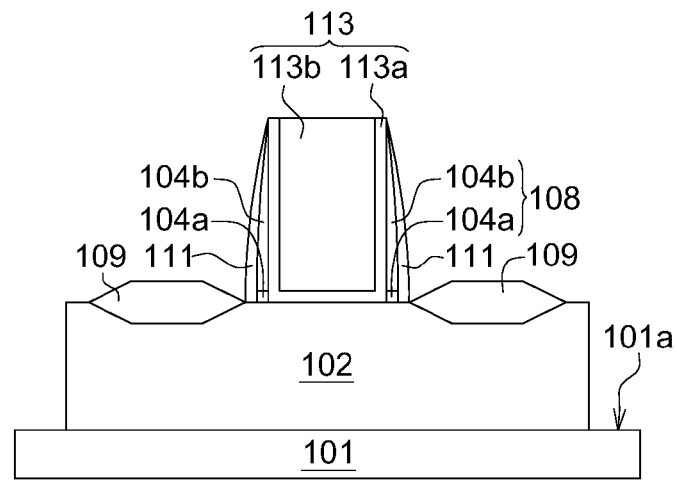
FIG. 1I is a cross-sectional view illustrating the resulting structure after a metal gate is formed on the structure depicted in FIG. 1H.

A metal gate 113 is then formed at the position (in the opening 112) where the gate structure 103 is initially disposed. FIG. 1I is a cross-sectional view illustrating the resulting structure after the metal gate 113 is formed on the structure depicted in FIG. 1H. In some embodiments of the present invention, the forming of the metal gate 113 comprising steps of forming a high dielectric constant (K) layer 113a on a bottom surface and sidewalls of the opening 112; and forming a metal electrode layer 113b optionally comprising a seed layer, a barrier layer, at least one work function layer or a silicide layer on the high K layer 113a. After a planarization process and a plurality of downstream processes (not shown) are carried out, the FinFET 100 shown in FIG. 1I is then formed.

Referring to FIG. 1I again, the FinFET 100 comprises the substrate 101, the fin 102, the gate structure (metal gate structure) 113 and the source/drain structure 109. The fin 102 protrudes from the surface 101a of the substrate 101. The gate structure 113 is disposed on the fin 102. The source/drain structure 109 is disposed in the fin 102 and adjacent to the gate structure 113. The FinFET 100 further comprises the gate spacer 108 disposed on the sidewalls of the gate structure 113. The gate spacer 108 has a composite structure at least comprising the spacer 111, a portion of the first material layer 1004a and a portion of the second material layer 104b, wherein the portion of the first material layer 104a and the portion of the second material layer 104b are stacked with each other and both are directly in contact with the gate structure 113. In the present embodiment, the first material layer 104a and the second material layer 104b are respectively made of silicon oxide and silicon nitride.

Figure 2A:
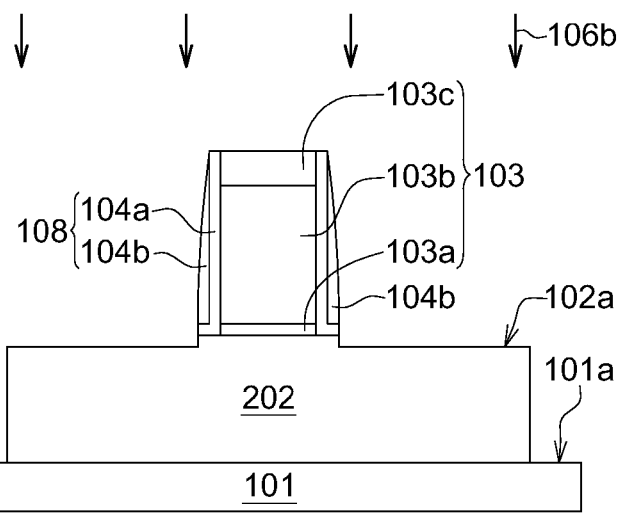
FIG. 2A is a cross-sectional view illustrating the resulting structure after the second etching process is carried out in accordance with another embodiment of the present invention.
Figure 2B:
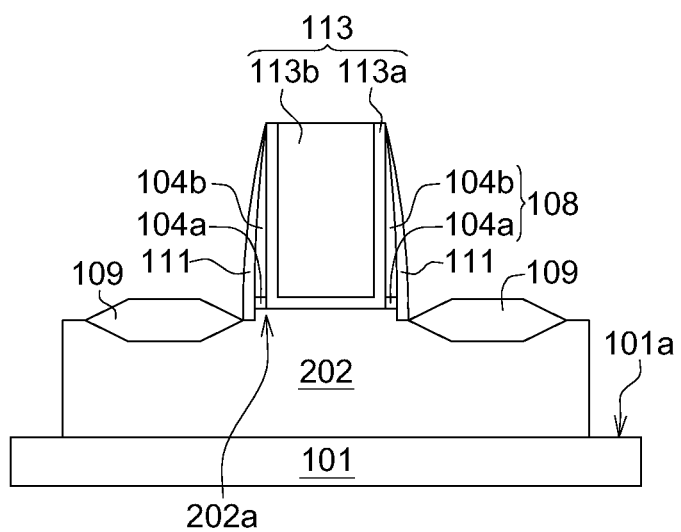
FIG. 2B is a cross-sectional view illustrating a FinFET fabricated on the basis of structure depicted in FIG. 2A.

In some other embodiments of the present invention, a portion of the fin 202 that are not covered by the gate structure 103 may be removed by the isotropic removing step 106b of the second etching process 106 (see FIG. 2A), so as to form a step structure 202a in the fin 202 adjacent to the bottom of the gate structure 103 (see FIG. 2B). Nevertheless a portion of the fin 202 is over etched, the etching process for define the gate spacer 108 still can be control more precisely, in comparison with the prior art, the over etch on fin 202 can be controlled in an acceptable situation and the gate spacer can be protected from being over etched by applying the aforementioned method of the present invention. Since the structure and method for fabricating the FinFET 200 are similar with that of the FinFET 100, thus the structure and method for fabricating thereof will not be redundantly described.

In accordance with the aforementioned embodiments of the present invention, a semiconductor device and method for fabricating the same are provided. In some embodiments, a gate structure is firstly formed on a semiconductor fin protruding from a surface of a substrate. A tri-layer stacking structure, such as a silicon oxide-silicon nitride-silicon oxide (ONO) structure, a silicon nitride-silicon oxide-silicon nitride (NON) structure or a silicon nitride-silicon oxide-metal (NOM) structure, is then formed to cover the gate structure. Subsequently, at least two etching processes are sequentially performed to form a gate spacer disposed on sidewalls of the gate structure. Each of the at least two etching processes can be precisely controlled due to the distinct etching selectivity of these etching processes for removing each two adjacent layers of these tree material layers that constitutes the tri-layer stacking structure. Thus, the problems of fin loss and spacer loss can be avoided by applying the tri-layer stacking structure during the process for defining the gate spacer.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for fabricating a semiconductor device, comprising:
    providing a substrate, wherein the substrate has a semiconductor fin protruding from a surface thereof;
    forming a gate structure on the semiconductor fin; and
    forming a stacking structure covering the gate structure and the semiconductor fin, wherein the stacking structure comprises a first material layer, a second material layer and a third material layer stacked in sequence;
    performing a first etching process, wherein the first etching process has an etching rate for removing the third material layer substantially greater than that for removing the second material layer; and
    performing a second etching process, wherein the second etching process has an etching rate for removing the second material layer substantially greater than that for removing the first material layer.

2. The method according to claim 1, wherein the first etching process comprises steps of using the second material layer as an etching stop layer to remove a portion of the third material layer, otherwise to remain another portion of the third material layer that is disposed on sidewalls of the gate structure.

3. The method according to claim 2, wherein the second etching process comprises steps of using the first material layer as an etching stop layer to remove a portion of the second material layer, otherwise to remain another portion of the second material layer that is disposed on the sidewalls of the gate structure.

4. The method according to claim 3, wherein the first material layer comprises silicon oxide; the second material layer comprises silicon nitride; and the third material layer comprises silicon oxide.

5. The method according to claim 4, wherein the first etching process comprises using carbon tetrafluoromethane ($CF_4$) as a reactive gas.

6. The method according to claim 4, wherein the second etching process comprises using fluoromethane ($CH_3F$), fluoromethane ($CH_2F_2$) or the combination thereof as a reactive gas.

7. The method according to claim 3, wherein the second etching process comprises an isotropic removing step used to remove the remaining portion of the third material layer, and a portion of the first material layer that are disposed on the sidewalls of the semiconductor fin but not covered by the remaining portion of the second material layer.

8. The method according to claim 3, wherein the first material layer comprises silicon nitride; the second material layer comprises silicon oxide; and the third material layer comprises silicon nitride.

9. The method according to claim 3, wherein the first material layer comprises silicon nitride; the second material layer comprises silicon oxide; and the third material layer comprises metal material.

10. The method according to claim 1, further comprising:
forming a source/drain structure on the semiconductor fin adjacent to the gate structure;
removing the gate structure; and
forming a metal gate structure at a position where the gate structure is initially disposed.

11. The method according to claim 10, wherein the forming of the metal gate structure comprises:
forming a high K layer on the semiconductor fin; and
forming a metal gate electrode on the high K layer.

12. The method according to claim 1, wherein the etching rate of the first etching process for removing the third material layer is 10 times greater than that for removing the second material layer.

13. The method according to claim 1, wherein the etching rate of the second etching process for removing the second material layer is 10 times greater than that for removing the first material layer.

* * * * *